(12) United States Patent
Matsuki

(10) Patent No.: US 6,455,445 B2
(45) Date of Patent: Sep. 24, 2002

(54) SILICONE POLYMER INSULATION FILM ON SEMICONDUCTOR SUBSTRATE AND METHOD FOR FORMING THE FILM

(75) Inventor: Nobuo Matsuki, Tama (JP)

(73) Assignee: ASM Japan K.K., Tama (JP)

( * ) Notice: Subject to any disclaimer, the term of this patent is extended or adjusted under 35 U.S.C. 154(b) by 0 days.

(21) Appl. No.: 09/820,075

(22) Filed: Mar. 28, 2001

Related U.S. Application Data

(63) Continuation of application No. 09/243,156, filed on Feb. 2, 1999, now abandoned.

(30) Foreign Application Priority Data

Feb. 5, 1998 (JP) .............................................. 10-37929

(51) Int. Cl.$^7$ .......................................... H01L 21/469
(52) U.S. Cl. ..................................................... 438/789
(58) Field of Search ........................ 427/589; 437/235; 438/758, 788, 789, 790

(56) References Cited

U.S. PATENT DOCUMENTS

| 5,314,724 A | * | 5/1994 | Tsukune et al. | ....... 427/255.37 |
| 5,380,555 A | | 1/1995 | Mine et al. | |
| 5,433,786 A | * | 7/1995 | Hu et al. | .................... 118/715 |
| 5,494,712 A | | 2/1996 | Hu et al. | |
| 5,554,570 A | | 9/1996 | Maeda et al. | |
| 5,989,998 A | | 11/1999 | Sugahara et al. | |
| 6,051,321 A | | 4/2000 | Lee et al. | |
| 6,054,379 A | | 4/2000 | Yau et al. | |
| 6,068,884 A | | 5/2000 | Rose et al. | |

FOREIGN PATENT DOCUMENTS

| EP | 0 826 791 A2 | 3/1998 |
| JP | 10-284486 | 10/1998 |

* cited by examiner

Primary Examiner—Michael Sherry
Assistant Examiner—Lisa Kilday
(74) Attorney, Agent, or Firm—Knobbe, Martens, Olson and Bear, LLP.

(57) ABSTRACT

A siloxan polymer insulation film has a dielectric constant of 3.3 or lower and has —SiR$_2$O— repeating structural units. The siloxan polymer has dielectric constant, high thermal stability and high humidity-resistance on a semiconductor substrate. The siloxan polymer is formed by directly vaporizing a silicon-containing hydrocarbon compound expressed by the general formula Si$_\alpha$O$_\beta$C$_x$H$_y$ ($\alpha$, $\beta$, x, and y are integers) and then introducing the vaporized compound to the reaction chamber of the plasma CVD apparatus. The residence time of the source gas is lengthened by reducing the total flow of the reaction gas, in such a way as to form a siloxan polymer film having a micropore porous structure with low dielectric constant.

18 Claims, 5 Drawing Sheets

SILICONE POLYMER INSULATION FILM ON SEMICONDUCTOR SUBSTRATE AND METHOD FOR FORMING THE FILM

This is a continuation of U.S. patent application Ser. No. 09/243,156, filed Feb. 2, 1999, now abandoned which claims priority based on Japanese patent application No. 37929/1998, filed Feb. 5, 1998. The entire disclosure of the parent application is hereby incorporated by reference.

BACKGROUND OF THE INVENTION

1. Field of the Invention

This invention relates generally to a semiconductor technique and more particularly to a silicone polymer insulation film on a semiconductor substrate and a method for forming the film by using a plasma CVD (chemical vapor deposition) apparatus.

2. Description of Related Art

Because of the recent rise in requirements for the large-scale integration of semiconductor devices, a multi-layered wiring technique attracts a great deal of attention. In these multi-layered structures, however, capacitance among individual wires hinders high-speed operations. In order to reduce the capacitance it is necessary to reduce the dielectric constant (relative permittivity) of the insulation film. Thus, various materials having a relatively low dielectric constant have been developed for insulation films.

Conventional silicon oxide films $SiO_x$ are produced by a method in which oxygen $O_2$ or nitrogen oxide $N_2O$ is added as an oxidizing agent to a silicon material gas such as $SiH_4$ or $Si(OC_2H_5)_4$ and then processed by heat or plasma energy. Its dielectric constant is about 4.0.

Alternatively, a fluorinated amorphous carbon film has been produced from $C_xF_yH_z$ as a material gas by a plasma CVD method. Its dielectric constant $\epsilon$ is as low as 2.0–2.4.

Another method to reduce the dielectric constant of insulation film has been made by using the good stability of Si—O bond. A silicon-containing organic film is produced from a material gas under low pressure (1 Torr) by the plasma CVD method. The material gas is made from P-TMOS (phenyl trimethoxysilane, formula 1), which is a compound of benzene and silicon, vaporized by a babbling method. The dielectric constant $\epsilon$ of this film is as low as 3.1.

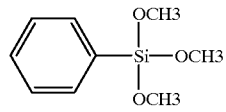

(1)

A further method uses a porous structure made in the film. An insulation film is produced from an inorganic SOG material by a spin-coat method. The dielectric constant $\epsilon$ of the film is as low as 2.3.

However, the above noted approaches have various disadvantages as described below.

First, the fluorinated amorphous carbon film has lower thermal stability (370° C.), poor adhesion with silicon-containing materials and also lower mechanical strength. The lower thermal stability leads to damage under high temperatures such as over 400° C. Poor adhesion may cause the film to peel off easily. Further, the lower mechanical strength can jeopardize wiring materials.

Oligomers that are polymerized using P-TMOS molecules do not form a linear structure in the vapor phase, such as a siloxane structure, because the P-TMOS molecule has three O—$CH_3$ bonds. The oligomers having no linear structure cannot form a porous structure on a Si substrate, i.e., the density of the deposited film cannot be reduced. As a result, the dielectric constant of the film cannot be reduced to a desired degree.

In this regard, the babbling method means a method wherein vapor of a liquid material, which is obtained by having a carrier gas such as argon gas pass through the material, is introduced into a reaction chamber with the carrier gas. This method generally requires a large amount of a carrier gas in order to cause the material gas to flow. As a result, the material gas cannot stay in the reaction chamber for a sufficient length of time to cause polymerization in a vapor phase.

Further, the SOG insulation film of the spin-coat method has a problem in that the material cannot be applied onto the silicon substrate evenly and another problem in which a cure system after the coating process is costly.

Object of the Invention

It is, therefore, a principal object of this invention to provide an improved insulation film and a method for forming it.

It is another object of this invention to provide an insulation film that has a low dielectric constant, high thermal stability, high humidity-resistance and high adhesive strength, and a method for forming it.

It is a further object of this invention to provide a material for forming an insulation film that has a low dielectric constant, high thermal stability, high humidity-resistance and high adhesive strength.

It is a still further object of this invention to provide a method for easily forming an insulation film that has a low dielectric constant without requiring an expensive device.

SUMMARY OF THE INVENTION

One aspect of this invention involves a method for forming an insulation film on a semiconductor substrate by using a plasma CVD apparatus including a reaction chamber, which method comprises a step of directly vaporizing a silicon-containing hydrocarbon compound expressed by the general formula $Si_\alpha O_\beta C_x H_y$ ($\alpha$, $\beta$, x, and y are integers) and then introducing it to the reaction chamber of the plasma CVD apparatus, a step of introducing an additive gas, the flow volume of which is substantially reduced, into the reaction chamber and also a step of forming an insulation film on a semiconductor substrate by plasma polymerization reaction wherein mixed gases made from the vaporized silicon-containing hydrocarbon compound as a material gas and the additive gas are used as a reaction gas. It is a remarkable feature that the reduction of the additive gas flow also results in a substantial reduction of the total flow of the reaction gas. According to the present invention, a silicone polymer film having a micropore porous structure with low dielectric constant can be produced.

The present invention is also drawn to an insulation film formed on a semiconductor substrate, and a material for forming the insulation film, residing in the features described above.

DETAILED DESCRIPTION OF THE PREFERRED EMBODIMENTS OF THE INVENTION

Basic Aspects

Figure 1:
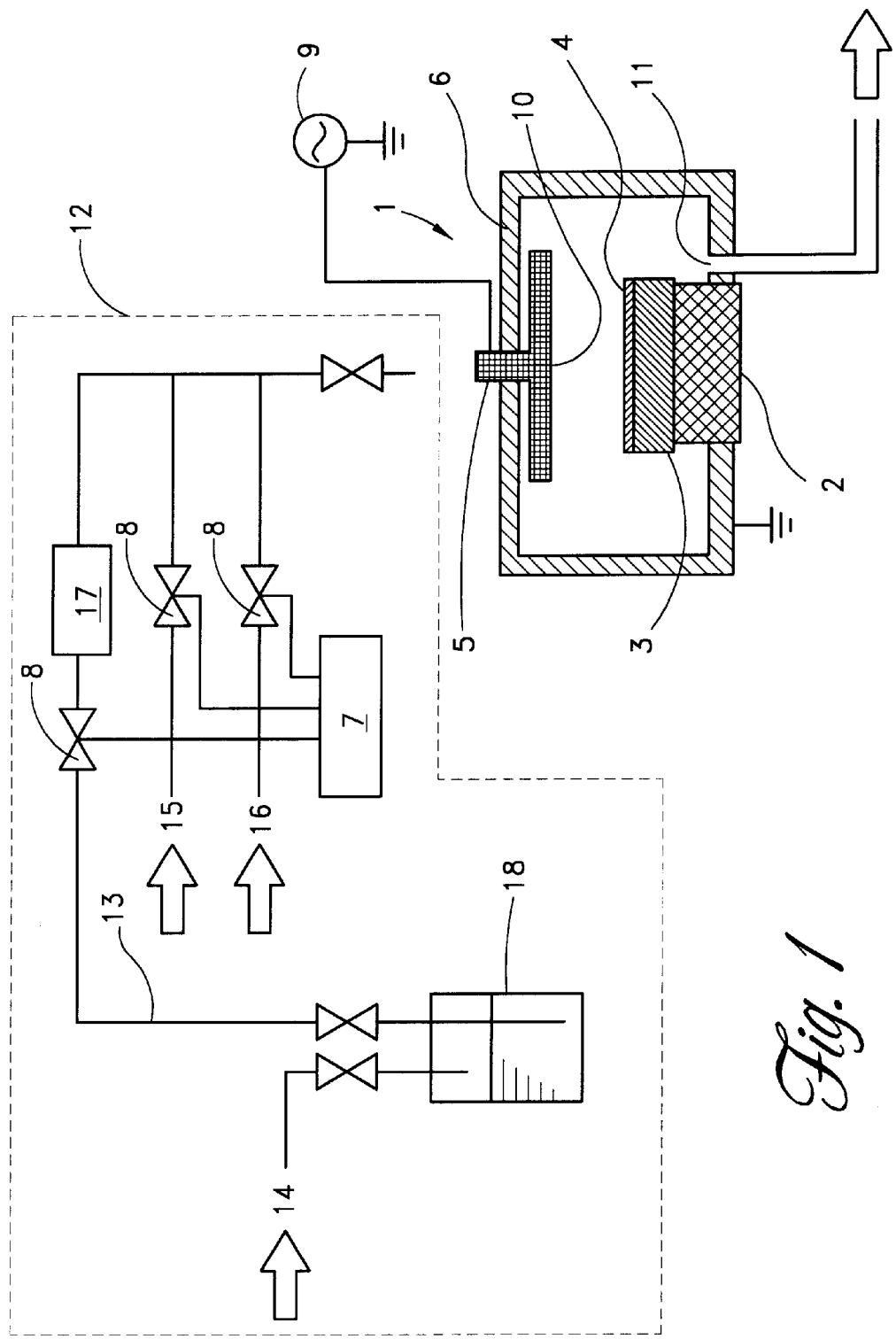
FIG. 1 is a schematic diagram illustrating a plasma CVD apparatus used for forming an insulation film of this invention.

In the present invention, the silicon-containing hydrocarbon compound expressed as the general formula $Si_\alpha O_\beta C_x H_y$ ($\alpha$, $\beta$, x, and y are integers) is preferably a compound having at least one Si—O bond, two or less O—$C_n H_{2n+1}$ bonds and at least two hydrocarbon radicals bonded with silicon (Si). More specifically, the silicon-containing hydrocarbon compound includes at least one species of the compound expressed by the chemical formula (2) as follows:

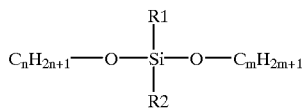

(2)

wherein R1 and R2 are one of $CH_3$, $C_2H_3$, $C_2H_5$, $C_3H_7$ and $C_6H_5$, and m and n are any integer.

Except for the species indicated above, the silicon-containing hydrocarbon compound can include at least one species of the compound expressed by the chemical formula (3) as follows:

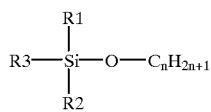

(3)

wherein R1, R2 and R3 are one of $CH_3$, $C_2H_3$, $C_2H_5$, $C_3H_7$ and $C_6H_5$, and n is any integer.

Except for those species indicated above, the silicon-containing hydrocarbon compound can include at least one species of the compound expressed by the chemical formula (4) as follows:

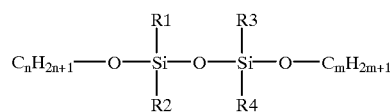

(4)

wherein R1, R2, R3 and R4 are one of $CH_3$, $C_2H_3$, $C_2H_5$, $C_3H_7$ and $C_6H_5$, and m and n are any integer.

Further, except for those species indicated above, the silicon-containing hydrocarbon compound can include at least one species of the compound expressed by the chemical formula (5) as follows:

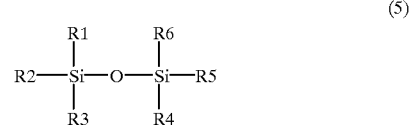

(5)

wherein R1, R2, R3, R4, R5 and R6 are one of $CH_3$, $C_2H_3$, $C_2H_5$, $C_3H_7$ and $C_6H_5$, and the additive gases are argon (Ar), Helium (He) and either nitrogen oxide ($N_2O$) or oxygen ($O_2$).

Furthermore, except for those species indicated above, the silicon-containing hydrocarbon compound can include at least one species of the compound expressed by the chemical formula (6) as follows:

(6)

wherein R1, R2, R3 and R4 are one of $CH_3$, $C_2H_3$, $C_2H_5$, $C_3H_7$ and $C_6H_5$, and the additive gases are argon (Ar), Helium (He) and either nitrogen oxide ($N_2O$) or oxygen ($O_2$).

Still further, the material gas can include at least one of said silicon-containing hydrocarbon compounds indicated above.

In accordance with another aspect of this invention, an insulation film is formed on a substrate and the film is polymerized with plasma energy in a plasma CVD apparatus by using a material gas including a silicon-containing hydrocarbon compound expressed by formula 2.

Additionally, the insulation film is formed on a substrate and the film is polymerized with plasma energy in a plasma CVD apparatus by using a material gas including a silicon-containing hydrocarbon compound expressed by formula 3.

Further, the insulation film is formed on a substrate and the film is polymerized with plasma energy in a plasma CVD apparatus by using a material gas including a silicon-containing hydrocarbon compound expressed by formula 4.

Furthermore, the insulation film is formed on a substrate and the film is polymerized with plasma energy in a plasma CVD apparatus by using a material gas including a silicon-containing hydrocarbon compound expressed by formula 5.

Still further, the insulation film is formed on a substrate and the film is polymerized with plasma energy in a plasma CVD apparatus by using a material gas including a silicon-containing hydrocarbon compound expressed by formula 6.

In accordance with a further aspect of this invention, a material for forming an insulation film is supplied in a vapor phase in the vicinity of a substrate and is treated in a plasma CVD apparatus to form the insulation film on the substrate by chemical reaction, and the material is further expressed by formula 2.

Additionally, a material for forming an insulation film is supplied in a vapor phase in the vicinity of a substrate and is treated in a plasma CVD apparatus to form the insulation film on the substrate by chemical reaction, and the material is further expressed by formula 3.

Further, a material for forming an insulation film is supplied in a vapor phase in the vicinity of a substrate and is treated in a plasma CVD apparatus to form the insulation film on the substrate by chemical reaction, and the material is further expressed by formula 4.

Furthermore, a material for forming an insulation film is supplied in a vapor phase with either nitrogen oxide ($N_2O$) or oxygen ($O_2$) as an oxidizing agent in the vicinity of a substrate and is treated in a plasma CVD apparatus to form said insulation film on said substrate by chemical reaction, and this material can be the compound expressed by formula 5.

Still further, a material for forming an insulation film is supplied in a vapor phase with either nitrogen oxide ($N_2O$) or oxygen ($O_2$) as the oxidizing agent in the vicinity of a substrate and is treated in a plasma CVD apparatus to form said insulation film on said substrate by chemical reaction, and this material further can be the compound expressed by formula 6.

Residence Time and Gas Flow

The residence time of the reaction gas is determined based on the capacity of the reaction chamber for reaction, the pressure adapted for reaction, and the total flow of the reaction gas. The reaction pressure is normally in the range of 1–10 Torr, preferably 3–7 Torr, so as to maintain stable plasma. This reaction pressure is relatively high in order to lengthen the residence time of the reaction gas. The total flow of the reaction gas is important to reducing the dielectric constant of a resulting film. It is not necessary to control the ratio of the material gas to the additive gas. In general, the longer the residence time, the lower the dielectric constant becomes. The material gas flow necessary for forming a film depends on the desired deposition rate and the area of a substrate on which a film is formed. For example, in order to form a film on a substrate [r(radius)=100 mm] at a deposition rate of 300 nm/min, at least 50 sccm of the material gas is expected to be included in the reaction gas. That is approximately $1.6 \times 10^2$ sccm per the surface area of the substrate ($m^2$). The total flow can be defined by residence time (Rt). When Rt is defined described below, a preferred range of Rt is 100 msec$\leq$Rt, more preferably 200 msec$\leq$Rt$\leq$5 sec. In a conventional plasma TEOS, Rt is generally in the range of 10–30 msec.

$$Rt[s] = 9.42 \times 10^7 (Pr \cdot Ts/Ps \cdot Tr) r_w^2 d/F$$

wherein:

Pr: reaction chamber pressure (Pa)

Ps: standard atmospheric pressure (Pa)

Tr: average temperature of the reaction gas (K)

Ts: standard temperature (K)

$r_w$: radius of the silicon substrate (m)

d: space between the silicon substrate and the upper electrode (m)

F: total flow volume of the reaction gas (sccm)

In the above, the residence time means the average period of time in which gas molecules stay in the reaction chamber. The residence time (Rt) can be calculated at Rt=$\alpha$V/S, wherein V is the capacity of the chamber (cc), S is the volume of the reaction gas (cc/s), and $\alpha$ is a coefficient determined by the shape of the reaction chamber and the positional relationship between the inlet of gas and the outlet of exhaust. The space for reaction in the reaction chamber is defined by the surface of the substrate ($\pi r^2$) and the space between the upper electrode and the lower electrode. Considering the gas flow through the space for reaction, $\alpha$ can be estimated as ½. In the above formula, $\alpha$ is ½.

Basic Effects

In this method, the material gas is, in short, a silicon-containing hydrocarbon compound including at least one Si-O bond, at most two O—$C_nH_{2n+1}$ bonds and at least two hydrocarbon radicals bonded to the silicon (Si). Also, this material gas is vaporized by a direct vaporization method. The method results in an insulation film having a low dielectric constant, high thermal stability and high humidity-resistance.

More specifically, the material gas vaporized by the direct vaporization method can stay in the plasma for a sufficient length of time. As a result, a linear polymer can be formed so that a linear polymer having the basic structure (formula 7), wherein the "n" is 2 or a greater value, forms in a vapor phase. The polymer is then deposited on the semiconductor substrate and forms an insulation film having a micropore porous structure.

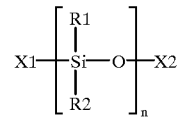

(7)

wherein X1 and X2 are $O_nC_mH_p$ wherein n is 0 or 1, m and p are integers including zero.

The insulation film of this invention has a relatively high stability because its fundamental structure has the Si-O bond having high bonding energy therebetween. Also, its dielectric constant is low because it has a micropore porous structure. Further, the fundamental structure (—Si—O—)$_n$ has, on both sides, dangling bonds ending with a hydrocarbon radical possessing hydrophobicity, and this property renders the humidity-resistance. Furthermore, the bond of a hydrocarbon radical and silicon is generally stable. For instance, both the bond with a methyl radical, i.e., Si—$CH_3$, and bond with benzene, i.e., Si—$C_6H_5$, have a dissociation temperature of 500° C. or higher. Since above semiconductor production requires thermal stability to temperatures above 450° C., that property of the film is advantageous for production of semiconductors.

Further aspects, features and advantages of this invention will become apparent from the detailed description of the preferred examples which follows.

Outline of Example Structures

FIG. 1 diagrammatically shows a plasma CVD apparatus usable in this invention. This apparatus comprises a reaction gas-supplying device 12 and a plasma CVD device 1. The reaction gas-supplying device 12 comprises plural lines 13, control valves 8 disposed in the lines 13, and gas inlet ports 14, 15 and 16. A flow controller 7 is connected to the individual control valves 8 for controlling a flow of a material gas of a predetermined volume. A container accommodating liquid reacting material 18 is connected to a vaporizer 17 that directly vaporizes liquid. The plasma CVD device 1 includes a reaction chamber 6, a gas inlet port 5, a susceptor 3 and a heater 2. A circular gas diffusing plate 10 is disposed immediately under the gas inlet port. The gas diffusing plate 10 has a number of fine openings at its bottom face and can inject reaction gas to the semiconductor substrate 4 therefrom. There is an exhaust port 11 at the bottom of the reaction chamber 6. This exhaust port 11 is connected to an outer vacuum pump (not shown) so that the inside of the reaction chamber 6 can be evacuated. The susceptor 3 is placed in parallel with and facing the gas diffusing plate 10. The susceptor 3 holds a semiconductor substrate 4 thereon and heats it with the heater 2. The gas inlet port 5 is insulated from the reaction chamber 6 and connected to an outer high frequency power supply 9. Alternatively, the susceptor 3 can be connected to the power supply 9. Thus, the gas diffusing plate 10 and the susceptor 3 act as a high frequency electrode and generate a plasma reacting field in proximity to the surface of the semiconductor substrate 4.

A method for forming an insulation film on a semiconductor substrate by using the plasma CVD apparatus of this invention comprises a step of directly vaporizing silicon-containing hydrocarbon compounds expressed by the general formula $Si_\alpha O_\beta C_x H_y$ ($\alpha$, $\beta$, x, and y are integers) and then introducing it to the reaction chamber 6 of the plasma CVD device 1, a step of introducing an additive gas, whose flow is substantially reduced, into the reaction chamber 6 and also a step of forming an insulation film on a semiconductor substrate by plasma polymerization reaction wherein mixed gases, made from the silicon-containing hydrocarbon compound as a material gas and the additive gas, are used as a reaction gas. It is a remarkable feature that the reduction of the additive gas flow also renders a substantial reduction of the total flow of the reaction gas. This feature will be described in more detail later.

Material Gas and Additive Gas

In this regard, the silicon-containing hydrocarbon compound expressed as the general formula $Si_\alpha O_\beta C_x H_y$ ($\alpha$, $\beta$, x, and y are integers) is preferably a compound having at least one Si—O bond, two or less O—$C_n H_{2n+1}$ bonds and at least two hydrocarbon radicals bonded with silicon (Si). More specifically, it is a compound indicated by (A) chemical formula:

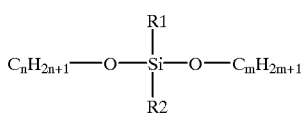

(2)

wherein R1 and R2 are one of $CH_3$, $C_2H_3$, $C_2H_5$, $C_3H_7$ and $C_6H_5$, and m and n are any integers;

a compound indicated by
(B) chemical formula:

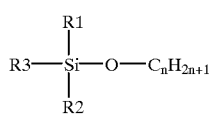

(3)

wherein R1, R2 and R3 are one of $CH_3$, $C_2H_3$, $C_2H_5$, $C_3H_7$ and $C_6H_5$, and n is any integer;

a compound indicated by
(C) chemical formula:

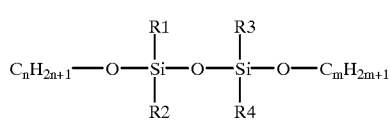

(4)

wherein R1, R2, R3 and R4 are one of $CH_3$, $C_2H_3$, $C_2H_5$, $C_3H_7$ and $C_6H_5$, and m and n are any integer;

a compound indicated by
(D) chemical formula:

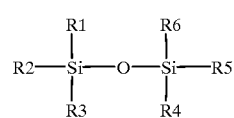

(5)

wherein R1, R2, R3, R4, R5 and R6 are one of $CH_3$, $C_2H_3$, $C_2H_5$, $C_3H_7$ and $C_6H_5$, and a mixture of the compound with nitrogen oxide ($N_2O$) or oxygen ($O_2$) as an oxidizing agent; or a compound indicated by
(E) chemical formula:

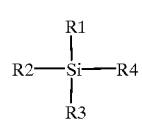

(6)

wherein R1, R2, R3 and R4 are one of $CH_3$, $C_2H_3$, $C_2H1$, $C3H_7$ and $C_6H_5$, and a mixture of the compound with nitrogen oxide ($N_2O$) or oxygen ($O_2$) as an oxidizing agent.

Further, it should be noted that the silicon-containing hydrocarbon compound can be any combinations of these compounds and mixtures.

The additive gases used in this embodiment, more specifically, are argon gas and helium gas. Argon is principally used for stabilizing plasma, while helium is used for improving uniformity of the plasma and also uniformity of thickness of the insulation film.

In the method described above, the first step of direct vaporization is a method wherein a liquid material, the flow of which is controlled, is instantaneously vaporized at a vaporizer that is preheated. This direct vaporization method requires no carrier gas such as argon to obtain a designated amount of the material gas. This differs greatly with the babbling method. Accordingly, a large amount of argon gas or helium gas is no longer necessary and this reduces the total gas flow of the reaction gas and then lengthens the time in which the material gas stays in the plasma. As a result, sufficient polymerizing reactions occur in the vapor so that a linear polymer can be formed and a film having a micropore porous structure can be obtained.

In FIG. 1, inert gas supplied through the gas inlet port 14 pushes out the liquid reacting material 18, which is the silicon-containing hydrocarbon compound, to the control valve 8 through the line 13. The control valve 8 controls the flow of the liquid reacting material 18 with the flow controller 7 so that it does not exceed a predetermined volume. The reduced silicon-containing hydrocarbon compound 18 goes to the vaporizer 17 to be vaporized by the direct vaporization method described above. Argon and helium are supplied through the inlet ports 15 and 16, respectively, and the valve 8 controls the flow volume of these gases. The mixture of the material gas and the additive gases, which is a reaction gas, is then supplied to the inlet port 5 of the plasma CVD device 1. The space between the gas diffusing plate 10 and the semiconductor substrate 4, both located inside of the reaction chamber 6 which is already evacuated, is charged with high frequency RF voltages, which are preferably 13.4 MHz and 430 kHz, and the space serves as a plasma field. The susceptor 3 continuously heats the semiconductor substrate 4 with the heater 2 and maintains the substrate 4 at a predetermined temperature that is desirably 350–450° C. The reaction gas supplied through the fine openings of the gas diffusing plate 10 remains in the plasma field in proximity to the surface of the semiconductor substrate 4 for a predetermined time.

If the residence time is short, a linear polymer cannot be deposited sufficiently so that the film deposited on the substrate does not form a micropore porous structure. Since the residence time is inversely proportional to the flow volume of the reaction gas, a reduction of the flow volume of the reaction gas can lengthen its residence time.

Extremely reducing the total volume of the reaction gas is effected by reducing the flow volume of the additive gas. As a result, the residence time of the reaction gas can be lengthened so that a linear polymer is deposited sufficiently and subsequently an insulation film having a micropore porous structure can be formed.

In order to adjust the reaction in the vapor phase, it is effective to add a small amount of an inert gas, an oxidizing agent, or a reducing agent to the reaction chamber. Helium (He) and Argon (Ar) are inert gases and have different first ionization energies of 24.56 eV and 15.76 eV, respectively. Thus, by adding either He or Ar singly or both in combination in predetermined amounts, the reaction of the material gas in the vapor phase can be controlled. Molecules of the reaction gas undergo polymerization in the vapor phase, thereby forming oligomers. The oligomers are expected to have a O:Si ratio of 1:1. However, when the oligomers form a film on the substrate, the oligomers undergo further polymerization, resulting in a higher oxygen ratio. The ratio varies depending on the dielectric constant or other characteristics of a film formed on the substrate (e.g., in Example 5 described later, the ratio was 3:2).

The remaining oxygen, which is derived from the material gas and is not incorporated into the film, is dissociated from the material compound and floats in plasma. The ratio of Si:O in the material gas varies depending upon the compound. For example, in formulae 2–6 above, the ratio of O:Si is 2:1, 1:1, 3:2, 1:2, and 0:1, respectively. If the material gas having a high ratio of O:Si (e.g., 3/2 or higher) is used, the quantity of oxygen floating in plasma increases. When the quantity of oxygen increases, the organic groups, which are directly bound to Si and necessary to form a film, are oxidized, and as a result, deterioration of the film is likely to occur. In the above, by adding a reducing agent such as $H_2$ and $CH_4$ to the reaction chamber, the oxygen partial pressure in plasma is reduced, thereby preventing the above oxidization of the organic groups. In contrast, when the O:Si ratio is low (e.g., 3/2 or lower), it is necessary to supply oxygen for forming a film by adding an oxidizing agent such as $N_2O$ and $O_2$. The appropriate amount of a reducing agent or an oxidizing agent can be evaluated in advance based on preliminary experiment in which the composition of a formed film is analyzed by FT-IR or XRS, and its dielectric constant is also analyzed. Accordingly, by selecting the appropriate type of additive gas such as He, Ar, a reducing agent, and an oxidizing agent, and by controlling the quantity of each gas to be added, a film having the desired quality can be produced.

Other Aspects

In the above, the silicon-containing hydrocarbon compound to produce a material gas for silicone polymer has preferably two alkoxy groups or less or having no alkoxy group. The use of a material gas having three or more alkoxy groups interferes with formation of linear silicone polymer, resulting in relatively high dielectric constant of a film. In the above, one molecule of the compound preferably contains one, two, or three Si atoms, although the number of Si atoms is not limited (the more the Si atoms, the vaporization becomes more difficult, and the cost of synthesis of the compound becomes higher). The alkoxy group may normally contain 1–3 carbon atoms, preferably one or two carbon atoms. Hydrocarbons bound to Si have normally 1–12 carbon atoms, preferably 1–6 carbon atoms. A preferable silicon-containing hydrocarbon compound has formula:

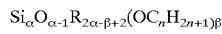

$$Si_\alpha O_{\alpha-1} R_{2\alpha-\beta+2}(OC_nH_{2n+1})_\beta$$

wherein $\alpha$ is an integer of 1–3, $\beta$ is 0, 1, or 2, n is an integer of 1–3, and R is $C_{1-6}$ hydrocarbon attached to Si. The use of an oxidizing agent or a reducing agent is determined depending on the target dielectric constant (3.30 or less, preferably 3.10 or less, more preferably 2.80 or less) of a silicone polymer film and other characteristics such as stability of dielectric constant and thermal stability. The O:Si ratio in the material gas is also considered to select an oxidizing agent or a reducing agent, as described above. Preferably, if the ratio is lower than 3:2, an oxidizing agent is used, whereas if the ratio is higher than 3:2, a reducing agent is used. Further, an inert gas such as Ar and He is for controlling plasma reaction, but is not indispensable to form a silicone polymer film. The flow of material gas and the flow of additive gas can also vary depending on the plasma CVD apparatus. The appropriate flow can be determined by correlating the dielectric constant of the silicone polymer film with the residence time of the reaction gas (composed of the material gas and the additive gas). The longer the residence time, the lower the dielectric constant becomes. A reduction rate of dielectric constant per lengthened residence time is changeable, and after a certain residence time, the reduction rate of dielectric constant significantly increases, i.e., the dielectric constant sharply drops after a certain residence time of the reaction gas. After this dielectric constant dropping range, the reduction of dielectric constant slows down. This is very interesting. In the present invention, by lengthening residence time until reaching the dielectric constant dropping range based on a predetermined correlation between the dielectric constant of the film and the residence time of the reaction gas, it is possible to reduce the dielectric constant of the silicone polymer film significantly.

EXAMPLES

Some preferred results in the experiments are described below. In these experiments, PM-DMOS (phenylmethyl dimethoxysilane, formula 1), DM-DMOS (dimethyl dimethoxysilane, formula 8), and P-TMOS were used as the material gas. An ordinary plasma CVD device (EAGLE-10™, ASM Japan K.K.) was used as an experimental device. The conditions for forming the film are as follows;

Additive gas: Ar and He

RF power supply: 250W (use the frequency made from 13.4 MHz and 430 kHz by synthesizing them with each other)

Substrate temperature: 400° C.

Reacting pressure: 7 Torr

Vaporizing method: direct vaporization

The residence time (Rt) is defined with the following formula.

$$Rt[s]=9.42\times10^7(Pr \cdot Ts/Ps \cdot Tr)r_w^2 d/F$$

In this formula, each abbreviation indicates the following parameter.

Pr: reaction chamber pressure (Pa)
Ps: standard atmospheric pressure (Pa)
Tr: average temperature of the reaction gas (K)
Ts: standard temperature (K)
$r_w$: radius of the silicon substrate (m)
d: space between the silicon substrate and the upper electrode (m)
F: total flow volume of the reaction gas (sccm)

Individual parameters were fixed at the following values; only the flow volume was varied so as to find out the relationship between the flow volume and the dielectric constant.

Pr=9.33×10² (Pa)
Ps=1.01×10⁵ (Pa)
Tr=273+400=673 (K)
Ts=273 (K)
$r_w$=0.1 (m)
d=0.014 (m)

Table 1 lists comparative examples and present invention's examples.

TABLE 1

| | Material Gas Flow (sccm) | Ar (sccm) | He (sccm) | Reaction Gas Total Flow (sccm) | Rt (msec) | Dielectric constant ε |
|---|---|---|---|---|---|---|
| C.Ex. 1 (P-TMOS) | 100 | 1000 | 1000 | 2100 | 24 | 3.38 |
| C.Ex. 2 (P-TMOS) | 100 | 10 | 10 | 120 | 412 | 3.42 |
| C.Ex. 3 (PM-DMOS) | 100 | 775 | 775 | 1650 | 30 | 3.41 |
| C.Ex. 4 (PM-DMOS) | 100 | 550 | 550 | 1200 | 41 | 3.41 |
| C.Ex. 5 (PM-DMOS) | 100 | 430 | 430 | 960 | 51 | 3.40 |
| C.Ex. 6 (PM-DMOS) | 100 | 310 | 310 | 720 | 68 | 3.35 |
| Ex. 1 (PM-DMOS) | 100 | 140 | 140 | 480 | 103 | 3.10 |
| Ex. 2 (PM-DMOS) | 100 | 100 | 100 | 300 | 165 | 2.76 |
| Ex. 3 (PM-DMOS) | 100 | 70 | 70 | 240 | 206 | 2.64 |
| Ex. 4 (PM-DMOS) | 100 | 10 | 10 | 120 | 412 | 2.45 |
| Ex. 5 (DM-DMOS) | 100 | 10 | 10 | 120 | 412 | 2.58 |
| Ex. 6 (DM-DMOS) | 25 | 3 | 0 | 28 | 1764 | 2.51 |
| Ex. 7 (DM-DMOS) | 25 | 0 | 5 | 30 | 1647 | 2.50 |
| Additive Gas Change | | H₂ (sccm) | CH₄ (sccm) | | | |
| Ex. 8 (DM-DMOS) | 100 | 20 | 0 | 120 | 412 | 2.52 |
| Ex. 9 (DM-DMOS) | 25 | 5 | 0 | 30 | 1647 | 2.49 |
| Ex. 10 (DM-DMOS) | 25 | 0 | 5 | 30 | 1647 | 2.67 |

Comparative Example 1

Material gas: P-TMOS (100 sccm)
Additive gases: Ar (1000 sccm) and He (1000 sccm)
Total flow volume of reaction gas: 2100 sccm
Other conditions and devices used for forming the film are given above. The calculated value of the residence time Rt was 24 msec. The conditions in this example reduced the dielectric constant ε of the insulation film to 3.38.

Comparative Example 2

Material gas: P-TMOS (100 sccm)
Additive gases: Ar (10 sccm) and He (10 sccm)
Total flow volume of reaction gas: 120 sccm
Other conditions and devices used for forming the film are given above. The calculated value of the residence time Rt was 412 msec. The conditions in this example reduced the dielectric constant ε of the insulation film to 3.42.

Comparative Example 3

Material gas: PM-DMOS (100 sccm)
Additive gases: Ar (775 sccm) and He (775 sccm)
Total flow volume of reaction gas: 1650 sccm
Other conditions and devices used for forming the film are given above. The calculated value of the residence time Rt was 30 msec. The conditions in this example reduced the dielectric constant ε of the insulation film to 3.41.

Comparative Example 4

Material gas: PM-DMOS (100 sccm)
Additive gases: Ar (550 sccm) and He (550 sccm)
Total flow volume of reaction gas: 1200 sccm
Other conditions and devices used for forming the film are given above. The calculated value of the residence time Rt was 41 msec. The conditions in this example reduced the dielectric constant ε of the insulation film to 3.41.

Comparative Example 5

Material gas: PM-DMOS (100 sccm)
Additive gas: Ar (430 sccm) and He (430 sccm)
Total flow volume of reaction gas: 960 sccm
Other conditions and devices used for forming the film are given above. The calculated value of the residence time Rt was 51 msec. The conditions in this example reduced the dielectric constant ε of the insulation film to 3.40.

Comparative Example 6

Material gas: PM-DMOS (100 sccm)
Additive gases: Ar (310 sccm) and He (310 sccm)
Total flow volume of reaction gas: 720 sccm
Other conditions and devices used for forming the film are given above. The calculated value of the residence time Rt was 68 msec. The conditions in this example reduced the dielectric constant ϵ of the insulation film to 3.35.

Example 1

Material gas: PM-DMOS (100 sccm)
Additive gases: Ar (140 sccm) and He (140 sccm)
Total flow volume of reaction gas: 480 sccm
Other conditions and devices used for forming the film are given above. The calculated value of the residence time Rt was 103 msec. The conditions in this example reduced the dielectric constant ϵ of the insulation film to 3.10.

Example 2

Material gas: PM-DMOS (100 sccm)
Additive gases: Ar (100 sccm) and He (100 sccm)
Total flow volume of reaction gas: 300 sccm
Other conditions and devices used for forming the film are given above. The calculated value of the residence time Rt was 165 msec. The conditions in this example reduced the dielectric constant ϵ of the insulation film to 2.76.

Example 3

Material gas: PM-DMOS (100 sccm)
Additive gases: Ar (70 sccm) and He (70 sccm)
Total flow volume of reaction gas: 240 sccm
Other conditions and devices used for forming the film are given above. The calculated value of the residence time Rt was 206 msec. The conditions in this example reduced the dielectric constant ϵ of the insulation film to 2.64.

Example 4

Material gas: PM-DMOS (100 sccm)
Additive gases: Ar (10 sccm) and He (10 sccm)
Total flow volume of reaction gas: 120 sccm
Other conditions and devices used for forming the film are given above. The calculated value of the residence time Rt was 412 msec. The conditions in this example reduced the dielectric constant ϵ of the insulation film to 2.45.

Figure 2:
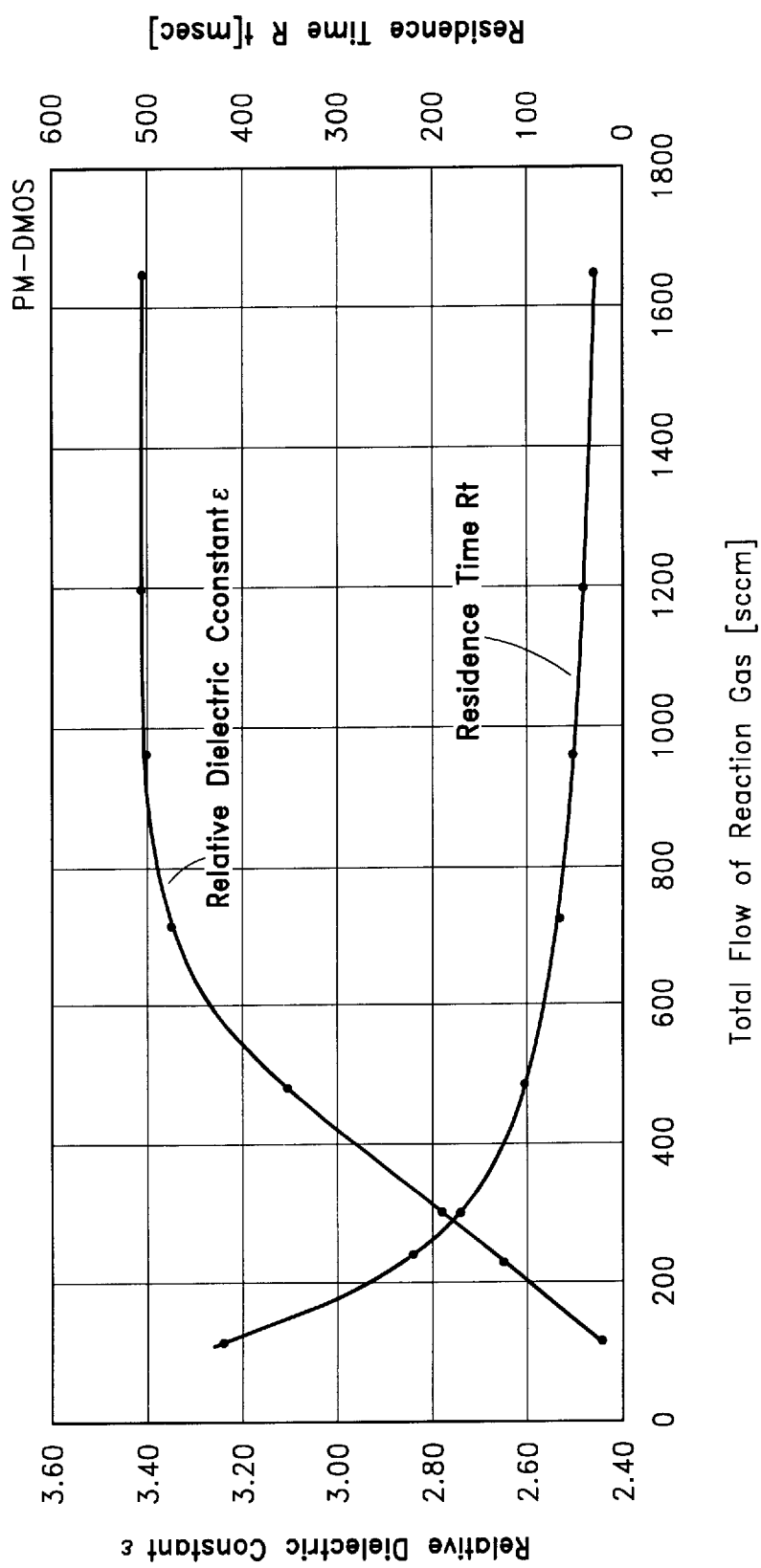
FIG. 2 is a graph showing the relationship between dielectric constant and the total flow of a reaction gas as well as the relationship between residence time and the total flow of a reaction gas, both in experiments using PM-DMOS as a material gas.
Figure 3:
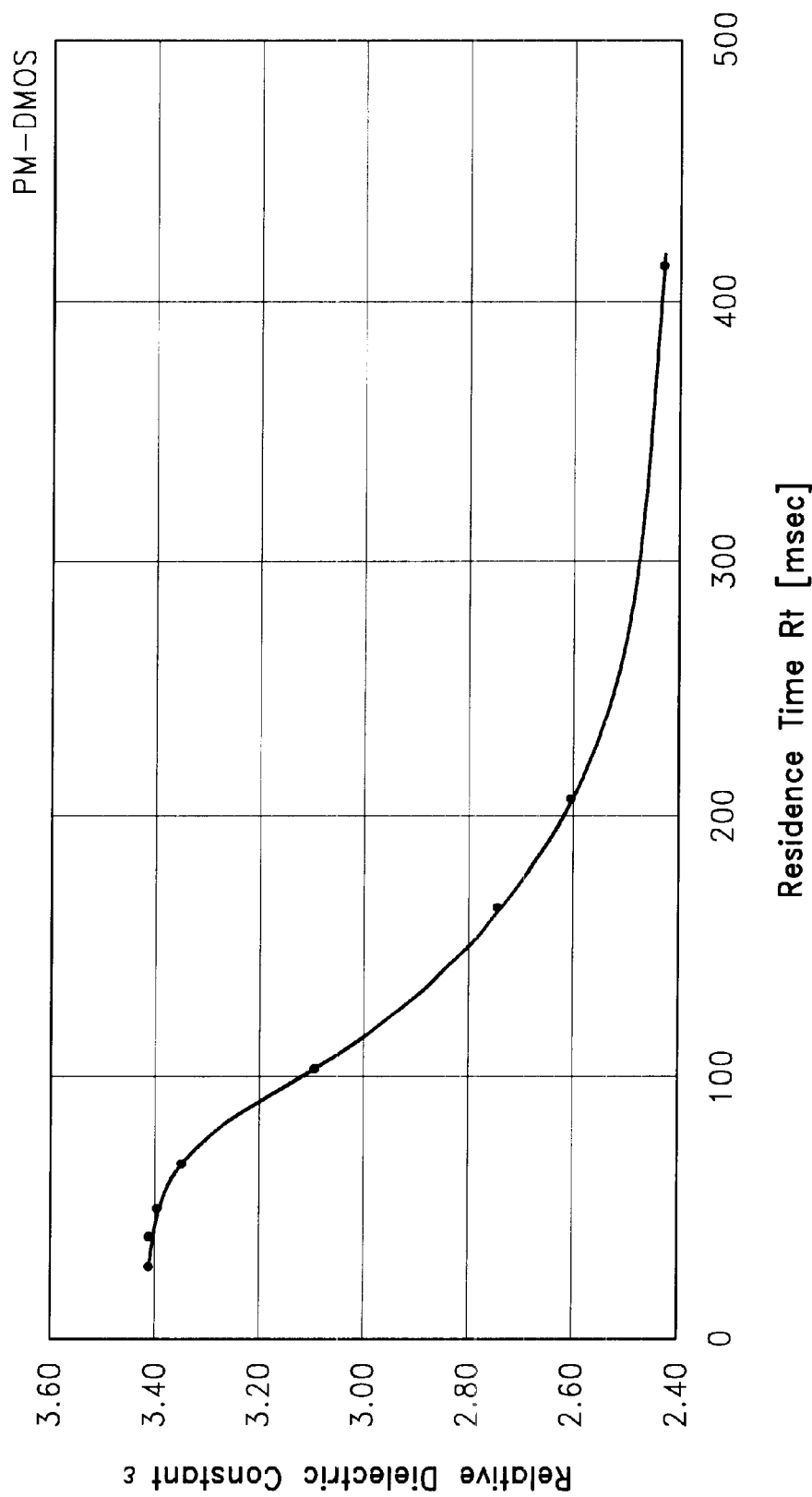
FIG. 3 is a graph showing the relationship between the residence time and dielectric constant in experiments using PM-DMOS as a material gas.

Hereinafter, the results given above will be examined with reference to FIGS. 2 and 3. FIG. 2 is a graph showing the relationship between the dielectric constant ϵ and the total flow volume of the reaction gas as well as the relationship between the residence time Rt and the total flow volume of the reaction gases, in the experiments using PM-DMOS as a material gas. FIG. 3 is a graph showing the relationship between the residence time Rt and the dielectric constant ϵ in the experiments using PM-DMOS as a material gas.

First, the relationship between the flow volume of the PM-DMOS gases and the dielectric constant ϵ of the insulation film will be examined. FIG. 2 shows that the dielectric constant ϵ is almost constantly 3.4 while the flow volume is about 700 sccm. However, the dielectric constant ϵ begins to fall with the decrease of the flow volume, i.e., at approximately 700 sccm or less. Further, as the flow volume falls to under 500 sccm, the residence time Rt rises drastically and the dielectric constant ϵ falls drastically. Meanwhile, FIG. 3 shows that the dielectric constant ϵ begins to decrease when the residence time Rt increases from approximately 70 msec. When the residence time Rt is greater than 400 msec, the dielectric constant ϵ falls to 2.45.

Thus, these present invention's examples apparently indicate that if the total flow of the reaction gas of the PM-DMOS gas and the additive gas is controlled so that Rt is more than 100 msec the dielectric constant ϵ can be controlled to be less than 3.1.

Example 5

DM-DMOS (formula 8) was then tested.

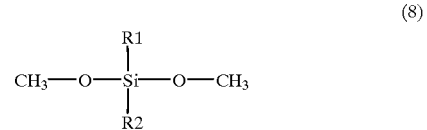

(8)

Material gas: DM-DMOS (100 sccm)
Additive gases: Ar (10 sccm) and He (10 sccm)
Total flow volume of reaction gas: 120 sccm
Other conditions and devices used for forming the film are given above. The calculated value of the residence time Rt was 412 msec. The conditions in this example reduced the dielectric constant ϵ of the insulation film to 2.58.

Example 6

Material gas: DM-DMOS (25 sccm)
Additive gases: Ar (3 sccm) and He (0 sccm)
Total flow volume of reaction gas: 28 sccm
Other conditions and devices used for forming the film are given above. The calculated value of the residence time Rt was 1764 msec. The conditions in this example reduced the dielectric constant ϵ of the insulation film to 2.51.

Example 7

Material gas: DM-DMOS (25 sccm)
Additive gases: Ar (0 sccm) and He (5 sccm)
Total flow volume of reaction gas: 30 sccm
Other conditions and devices used for forming the film are given above. The calculated value of the residence time Rt was 1647 msec. The conditions in this example reduced the dielectric constant ϵ of the insulation film to 2.50.

Example 8

Material gas: DM-DMOS (100 sccm)
Additive gases: $H_2$ (20 sccm) and $CH_4$ (0 sccm)
Total flow volume of reaction gas: 120 sccm
Other conditions and devices used for forming the film are given above. The calculated value of the residence time Rt was 412 msec. The conditions in this example reduced the dielectric constant ϵ of the insulation film to 2.52.

Example 9

Material gas: DM-DMOS (25 sccm)
Additive gases: $H_2$ (5 sccm) and $CH_4$ (0 sccm)
Total flow volume of reaction gas: 30 sccm
Other conditions and devices used for forming the film are given above. The calculated value of the residence time Rt was 1647 msec. The conditions in this example reduced the dielectric constant ϵ of the insulation film to 2.49.

Example 10

Material gas: DM-DMOS (25 sccm)
Additive gases: $H_2$ (0 sccm) and $CH_4$ (5 sccm)
Total flow volume of reaction gas: 30 sccm
Other conditions and devices used for forming the film are given above. The calculated value of the residence time Rt was 1647 msec. The conditions in this example reduced the dielectric constant ϵ of the insulation film to 2.67.

Thus, the above reveals that, in the material gas of formula 2, both compounds (PM-DMOS having $C_6H_5$ at R1 and $CH_3$ at R2 and DM-DMOS having $CH_3$ at R1 and $CH_3$ at R2) can produce insulation films having a very low dielectric constant ($\epsilon<3.1$).

The following will examine if the P-TMOS gas replacing the PM-DMOS gas can render the same results. Comparative Examples 1 and 2 both are the results obtained in the experiments using the P-TMOS as a material gas. These examples indicate that the dielectric constant does not decrease even when the total flow of the reaction gas is reduced to 5.7%. Thus, the relationship between the flow volume and the dielectric constant that is effected with PM-DMOS does not come into effect with P-TMOS.

Further, the following will examine differences of dielectric constant when using different material gases. Comparing Comparative Example 2 with the present invention's Example 4, although the flow volumes and other conditions are identical, the dielectric constant $\epsilon$ of P-TMOS is 3.42 while the dielectric constant $\epsilon$ of PM-DMOS is 2.45. Such a large difference between the dielectric constant values resides in the difference in the molecular structures of the material gases. That is, PM-DMOS has a pair of relatively unstable O—$CH_3$ bonds which are prone to separation so that that polymerization reactions occur and a linear polymer (formula 7) forms in a gaseous state. This polymer is deposited on a semiconductor substrate, forming a micropore porous structure and subsequently the dielectric constant of the insulation film decreases. In contrast, because P-TMOS has three O—$CH_3$ bonds, its polymer is not deposited linearly even though the residence time is lengthened. Accordingly, the deposited film does not have the micropore porous structure nor such a low dielectric constant.

These experiments have revealed that it is preferable that the silicon-containing hydrocarbon compounds used as the material gases should have not only the Si—O bonds but also at most two O—$C_nH_{2n+1}$ bonds and, further, at least two hydrocarbon radicals bonded to the silicon (Si).

Film stability characteristics of low dielectric constant films formed according to the present invention were evaluated by preparing low dielectric constant films according to Example 4, wherein PM-DMOS was used, and Example 5, wherein DM-DMOS was used, thereby evaluating their stability of dielectric constant and their thermal stability.

(1) Stability of Dielectric constant

Changes in dielectric constant of the films were measured upon heating and humidifying the PM-DMOS film and the DM-DMOS film in a pressure cooker. That is, each film was formed on a Si wafer at a thickness of 1 μm, and its dielectric constant was measured upon formation of the film and after being placed at 120° C. and 100% humidity for one hour. The results are shown below. No change in dielectric constant of each film was detected, i.e., indicating high stability characteristics.

TABLE 2

|  | Dielectric constant | |
| --- | --- | --- |
| Material Gas | Upon Formation | One Hour at High Temp. and Humid. |
| Example 4 PM-DMOS | 2.45 | 2.45 |
| Example 5 DM-DMOS | 2.58 | 2.58 |

(2) Thermal Stability

Figure 4:
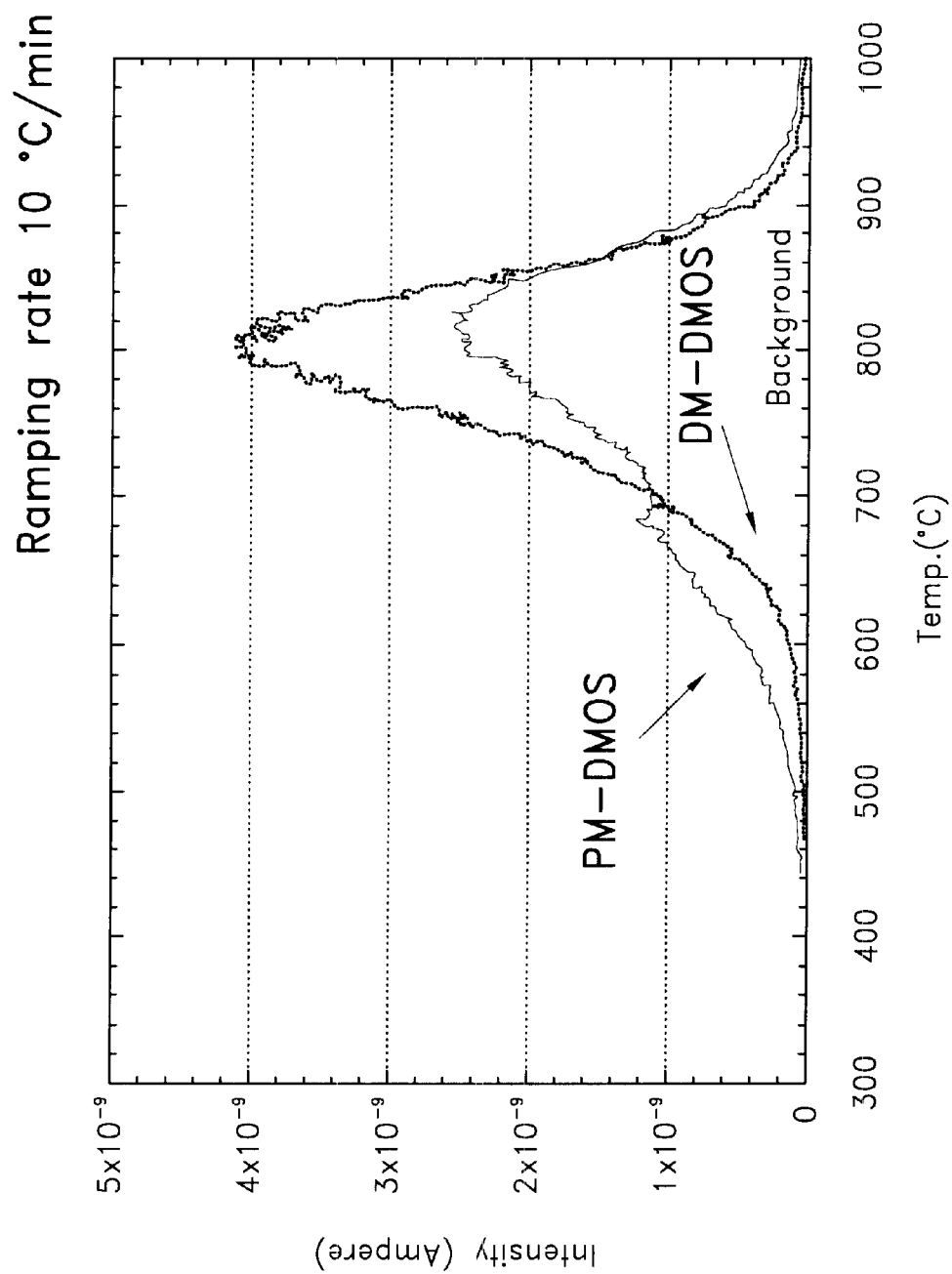
FIG. 4 is a graph showing the thermal desorption spectra of components having a molecular weight of 16 due to desorption of $CH_4$ from films (PM-DMOS, DM-DMOS) according to the present invention in a thermal desorption test.
Figure 5:
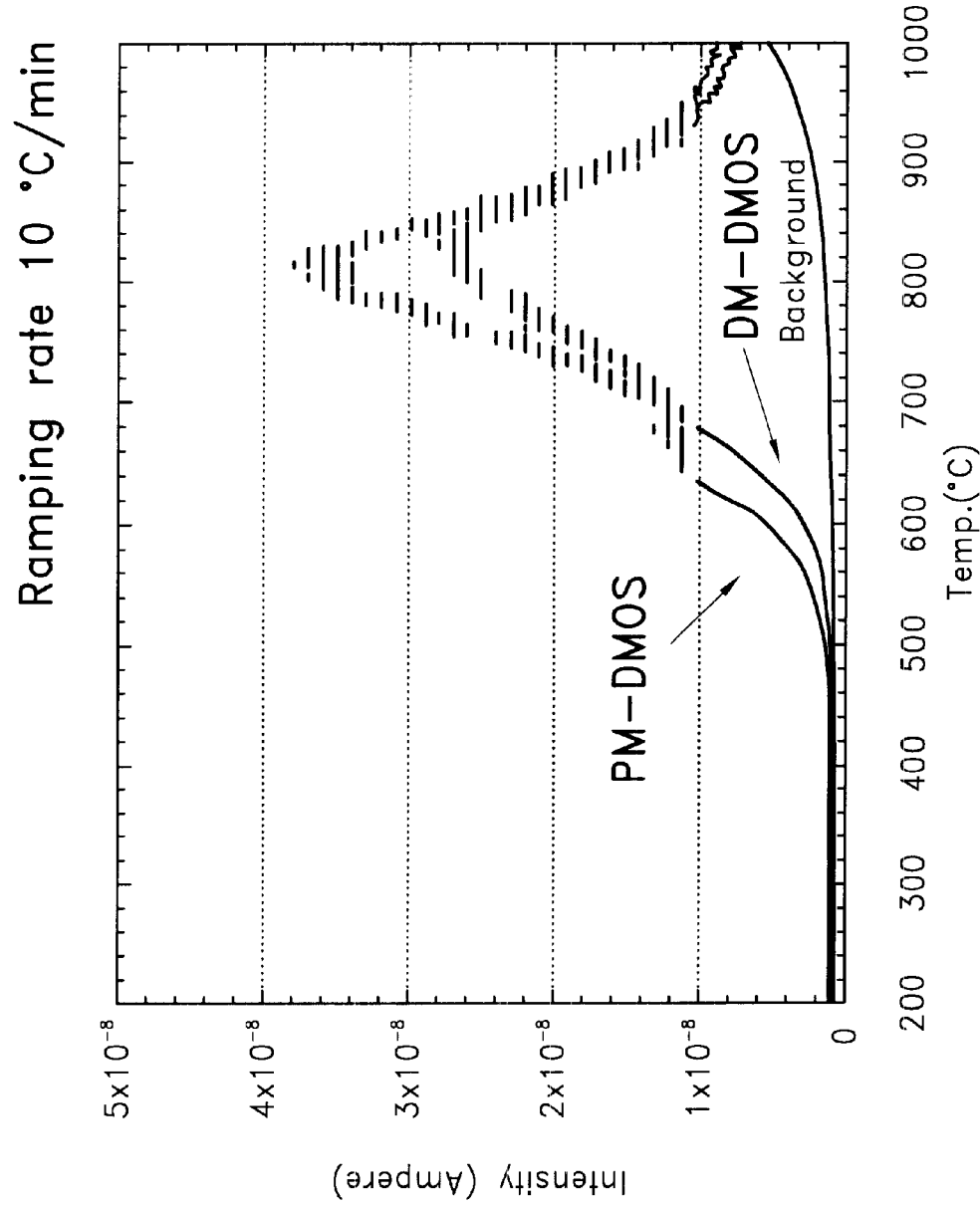
FIG. 5 is a graph showing changes in the degree of vacuum corresponding to the number of total molecules dissociated from the films (PM-DMOS, DM-DMOS), i.e., pressure raises due to gas dissociated from the films in the thermal desorption test.

Based on a thermal desorption test, thermal stability of film structures was evaluated. That is, the samples of PM-DMOS formed on the Si wafer and DM-DMOS formed on the Si wafer were placed in a vacuum and subjected to rising temperature at a rate of 10° C. per minute, thereby measuring the amount of molecules dissociated from the film. FIG. 4 is a graph showing the thermal desorption spectra of components having a molecular weight of 16 due to desorption of $CH_4$ during the temperature rise. FIG. 5 is a graph showing changes in the degree of vacuum corresponding to the number of total molecules dissociated from the film. In both experiments, no desorption was detected in either film at a temperature of 400° C. or lower. Desorption began at approximately 450° C. in PM-DMOS and at approximately 500° C. in DM-DMOS. Thermal stability required for low dielectric constant films is generally for 400° C. to 450° C. Therefore, it was proved that both the PM-DMOS film and the DM-DMOS film had high thermal stability.

As described above, the method of this invention using the silicon-containing hydrocarbon compounds of this invention as the material gases produces an insulation film that has high thermal stability, high humidity-resistance and a low dielectric constant. Additionally, it is found that controlling the residence time of the reaction gas can effectively and easily control the dielectric constant of the film. Further, the method of this invention actualizes easy production of insulation films without using expensive devices.

Although this invention has been described in terms of certain examples, other examples apparent to those of ordinary skill in the art are within the scope of this invention. Accordingly, the scope of the invention is intended to be defined only by the claims that follow.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method for forming a siloxan polymer insulation film on a semiconductor substrate by plasma treatment, comprising the steps of:

vaporizing a silicon-containing hydrocarbon compound to produce a material gas for silicone polymer, said silicon-containing hydrocarbon having the formula $Si_\alpha O_{\alpha-1} R_{2\alpha-\beta+2}(OC_nH_{2n+1})_\beta$ wherein $\alpha$ is an integer of 1–3, $\beta$ is 0, 1, or 2, n is an integer of 1–3, and R is $C_{1-6}$ hydrocarbon attached to Si;

introducing the material gas into a reaction chamber for plasma CVD processing wherein a semiconductor substrate is placed;

introducing an additive gas comprising an inert gas and optionally an oxidizing gas, said oxidizing gas being used in an amount less than the material gas; and forming a siloxan polymer film having —$SiR_2O$— repeating structural units on the semiconductor substrate by activating plasma polymerization reaction in the reaction chamber where a reaction gas composed of the material gas and the additive gas is present, while controlling the flow of the reaction gas to lengthen a residence time, Rt, of the reaction gas in the reaction chamber, wherein 100 msec$\leq$Rt, $$Rt[s]=9.42\times10^7(Pr\cdot Ts/Ps\cdot Tr)r_w^2 d/F$$

wherein:

Pr: reaction chamber pressure (Pa)

Ps: standard atmospheric pressure (Pa)

Tr: average temperature of the reaction gas (K)

Ts: standard temperature (K)

$r_w$: radius of the silicon substrate (m)

d: space between the silicon substrate and the upper electrode (m)

F: total flow volume of the reaction gas (sccm).

2. The method according to claim 1, wherein the residence time is determined by correlating the dielectric constant with the residence time.

3. The method according to claim 1, wherein the additive gas comprises at least either argon (Ar) or Helium (He).

4. The method according to claim 1, wherein the flow of the reaction gas is controlled to render the relative dielectric constant of the silicone polymer film lower than 3.30.

5. The method according to claim 1, wherein the flow of the reaction gas is controlled to render the dielectric constant of the silicone polymer film no more than 3.1.

6. The method according to claim 1, wherein Rt is no less than 165 msec.

7. The method according to claim 1, wherein the additive gas is exclusively an inert gas.

8. A method for forming a siloxan polymer insulation film on a semiconductor substrate by plasma treatment, comprising the steps of:

vaporizing a silicon-containing hydrocarbon compound to produce a material gas for silicone polymer, said silicon-containing hydrocarbon having the formula $Si_\alpha O_{\alpha-1} R_{2\alpha-\beta+2}(OC_n H_{2n+1})_\beta$ wherein $\alpha$ is an integer of 1–3, $\beta$ is 0 or 1, n is an integer of 1–3, and R is $C_{1-6}$ hydrocarbon attached to Si;

introducing the material gas into a reaction chamber for plasma CVD processing wherein a semiconductor substrate is placed;

introducing an additive gas comprising an inert gas and an oxidizing gas, said oxidizing gas being used in an amount less than the material gas; and forming a siloxan polymer film having —SiR$_2$O— repeating structural units on the semiconductor substrate by activating plasma polymerization reaction in the reaction chamber where a reaction gas composed of the material gas and the additive gas is present, while controlling the flow of the reaction gas to lengthen a residence time, Rt, of the reaction gas in the reaction chamber, wherein 100 msec$\leq$Rt, $$Rt[s]=9.42 \times 10^7 (Pr \cdot Ts/Ps \cdot Tr) r_w^2 d/F$$

wherein:

Pr: reaction chamber pressure (Pa)

Ps: standard atmospheric pressure (Pa)

Tr: average temperature of the reaction gas (K)

Ts: standard temperature (K)

$r_w$: radius of the silicon substrate (m)

d: space between the silicon substrate and the upper electrode (m)

F: total flow volume of the reaction gas (sccm).

9. A method for forming a siloxan polymer insulation film on a semiconductor substrate by plasma treatment, comprising the steps of:

vaporizing a silicon-containing hydrocarbon compound to produce a material gas for silicone polymer, said silicon-containing hydrocarbon having the general formula $Si_\alpha O_\beta C_x H_y$ wherein $\alpha, \beta, x$, and y are integers;

introducing the material gas into a reaction chamber for plasma CVB processing wherein a semiconductor substrate is placed;

introducing an additive gas; and forming a siloxan polymer film having –SiR$_2$O– repeatin structural units on the semiconductor substrate by activating plasma polymerization in the reaction chamber where a reaction gas composed of the material gas and the additive gas is present, while controlling the flow of the reaction gas to lenghthen a residence time, Rt, of the reaction gas in the reaction chamber, wherein 100 msec$\leq$Rt, $$Rt=9.42 \times 10^7 (Pr.Ts/Ps.Tr) r_w^2 d/f$$

wherein:

Pr: reaction chamber pressure (Pa)

Ps: standard atmospheric pressure (Pa)

Tr: average temperature of the reaction gas (K)

Ts: standard temperature (K)

$r_w$: radius of the silicon substrate (m)

d: space between the silicon substrate and the upper electrode (m)

F: total flow volume of the reaction gas (sccm).

10. The method according to claim 9, wherein the alkoxy present in the silicon-containing hydrocarbon compound has 1 to 3 carbon atoms.

11. The method according to claim 9, wherein the hydrocarbon present in the silicon-containing hydrocarbon compound has 1 to 6 carbon atoms.

12. The method according to claim 9, wherein the silicon-containing hydrocarbon compound has 1 to 3 silison atoms.

13. The method according to claim 9, wherein the silicon-containing hydrocarbon compound has formula $Si_\alpha O_{\alpha-1} R_{2\alpha\beta+2}(OC_n H_{2n+1})_\beta$ wherein $\alpha$ is an integer of 1–3, $\beta$ is 0, 1, or 2, n is an integer of 1–3, and R is $C_{1-6}$ hydrocarbon attached Si.

14. The method according to claim 9, wherein the additive gas comprises at least either argon (Ar) or Helium (He).

15. The method according to claim 9, wherein the additive gas comprises either an oxidizing agent or a reducing agent.

16. The method according to claim 14, wherein the additive gas further comprises either an oxidizing agent or a reducing agent.

17. The method according to claim 9, wherein the silicon-containing hydrocarbon compound is selected from the group consisting of:

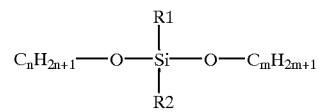

wherein R1 and R2 are independently $CH_3$, $C_2H_3$, $C_2H_5$, $C_3H_7$ or $C_6H_5$, and m and n are any integer,

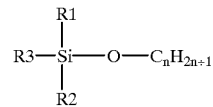

wherein R1, R2 and R3 are independently $CH_3$, $C_2H_3$, $C_2H_5$, $C_3H_7$ or $C_6H_5$, and n is any integer,

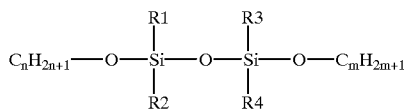

wherein R1, R2, R3 and R4 are independently CH$_3$, C$_2$H$_3$, C$_2$H$_5$, C$_3$H$_7$ or C$_6$H$_5$, and m and n are any integer,

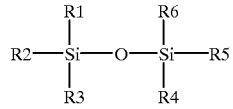

wherein R1, R2, R3, R4, R5 and R6 are independently CH$_3$, C$_2$H$_3$, C$_2$H$_5$, C$_3$H$_7$ or C$_6$H$_5$, ir the additive gases are argon (Ar), Helium (He) and either nitrogen oxide (N$_2$O) or oxygen (O$_2$), and

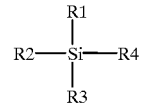

wherein R1, R2, R3 and R4 are independently CH$_3$, C$_2$H$_3$, C$_2$H$_5$, C$_3$H$_7$ or C$_6$H$_5$, if the additive gases are argon (Ar), Helium (He) and either nitrogen oxide (N$_2$O) or oxygen (O$_2$).

18. The method according to claim 9, wherein the flow of the reaction gas is controlled to render the relative dielectic constant of the silicone polymer film lower than 3.30.

* * * * *

UNITED STATES PATENT AND TRADEMARK OFFICE
CERTIFICATE OF CORRECTION

PATENT NO. : 6,455,445 B2  
DATED : September 24, 2002  
INVENTOR(S) : Nobuo Matsuki It is certified that error appears in the above-identified patent and that said Letters Patent is hereby corrected as shown below:

Column 18,  
Line 2, delete "repeatin" and insert -- repeating --;  
Line 8, delete "lenghthen" and insert -- lengthen --;  
Line 33, delete "silison" and insert -- silicon --.

Signed and Sealed this

First Day of July, 2003

JAMES E. ROGAN  
*Director of the United States Patent and Trademark Office*